US009697458B2

(12) United States Patent
Murayama et al.

(10) Patent No.: US 9,697,458 B2
(45) Date of Patent: *Jul. 4, 2017

(54) ANTENNA MODULE

(71) Applicant: Murata Manufacturing Co., Ltd., Nagaokakyo-shi, Kyoto-fu (JP)

(72) Inventors: Hiromi Murayama, Nagaokakyo (JP); Yuya Dokai, Nagaokakyo (JP); Tsuyoshi Mukai, Nagaokakyo (JP); Kazuaki Higashibata, Nagaokakyo (JP); Masato Nomura, Nagaokakyo (JP); Noboru Kato, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/426,220

(22) Filed: Feb. 7, 2017

(65) Prior Publication Data

US 2017/0147917 A1 May 25, 2017

Related U.S. Application Data

(63) Continuation of application No. 14/629,536, filed on Feb. 24, 2015, now Pat. No. 9,607,258, which is a (Continued)

(30) Foreign Application Priority Data

Dec. 7, 2012 (JP) ................................. 2012-268548

(51) Int. Cl.
G06K 19/06 (2006.01)
G06K 19/077 (2006.01)
(Continued)

(52) U.S. Cl.
CPC . *G06K 19/07758* (2013.01); *G06K 19/07722* (2013.01); *G06K 19/07783* (2013.01);
(Continued)

(58) Field of Classification Search
CPC .. G06K 19/07; G06K 19/0723; G06K 19/077; G06K 19/0772; G06K 19/07722;
(Continued)

(56) References Cited

U.S. PATENT DOCUMENTS 8,991,717 B2* 3/2015 Murayama ........... H01Q 1/2283
235/492
2015/0170017 A1* 6/2015 Murayama ........... H01Q 1/2283
235/488

OTHER PUBLICATIONS

Murayama et al., "Antenna Module", U.S. Appl. No. 14/629,536, filed Feb. 24, 2015.

* cited by examiner

*Primary Examiner* — Thien M Le
*Assistant Examiner* — April Taylor
(74) *Attorney, Agent, or Firm* — Keating & Bennett, LLP

(57) ABSTRACT

An antenna module includes an antenna element including coil patterns and via conductors coupling together two adjacent two coil patterns. At least one of the coil patterns has a spiral shape, is wound three or more turns parallel or substantially parallel to an outer edge of a principal surface of a multilayer body, includes a first partial pattern including an outer end portion, a second partial pattern extending parallel or substantially parallel with the first partial pattern and being adjacent to the first partial pattern with a first gap provided therebetween, and a third partial pattern extending parallel or substantially parallel with the second partial pattern and being adjacent to the second partial pattern with a second gap provided therebetween, the second gap being smaller than the first gap.

4 Claims, 9 Drawing Sheets

Related U.S. Application Data continuation of application No. 14/328,858, filed on Jul. 11, 2014, now Pat. No. 8,991,717, which is a continuation of application No. PCT/JP2013/082581, filed on Dec. 4, 2013.

(51) Int. Cl.
*H01Q 1/22* (2006.01)
*H01Q 7/00* (2006.01)

(52) U.S. Cl.
CPC ......... *H01Q 1/2225* (2013.01); *H01Q 1/2283* (2013.01); *H01Q 7/00* (2013.01)

(58) Field of Classification Search
CPC ......... G06K 19/07749; G06K 19/0775; G06K 19/0773; G06K 19/07777; G06K 19/07779; G06K 19/07781; G06K 19/07783; G06K 19/07784; H01Q 1/00; H01Q 1/2225; H01Q 1/2283; H01Q 7/00
See application file for complete search history.

F I G . 4
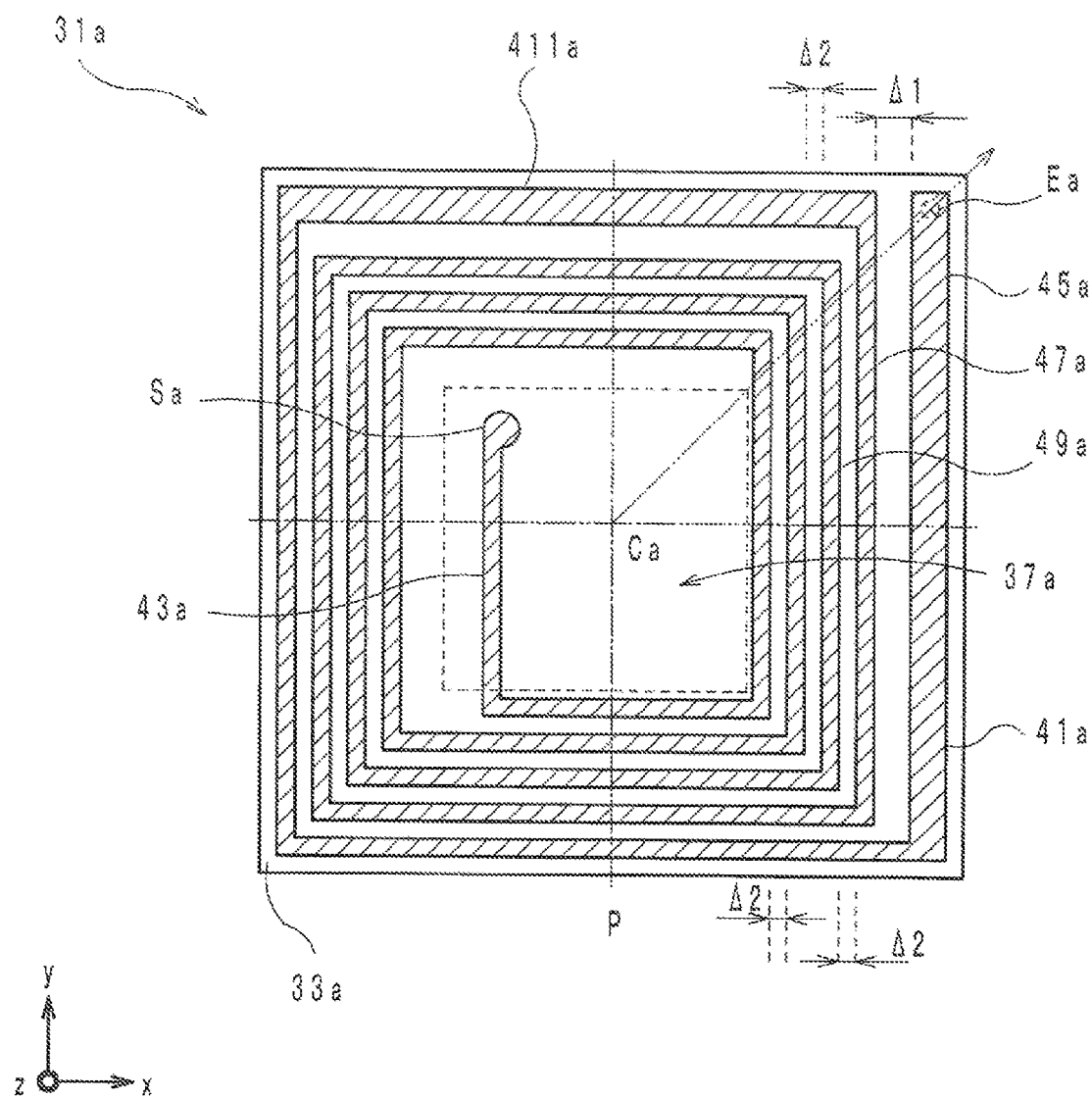

ANTENNA MODULE

This application is based on Japanese Patent Application No. 2012-268548 filed on Dec. 7, 2012 and PCT/JP2013/082581 filed on Dec. 4, 2013, the contents of which are incorporated herein by reference.

BACKGROUND OF THE INVENTION

1. Field of the Invention

The present invention relates to antenna modules including an antenna element, an IC chip, and a multilayer body in or on which the antenna element and the IC chip are provided.

2. Description of the Related Art

An antenna module of this type is disclosed in, for example, Japanese Patent No. 4997779 identified below. This antenna module includes a multilayer body in which a plurality of insulative bases are stacked up in a predetermined direction. On the surface of each base, a spiral-shaped coil pattern is provided. The coil patterns which are adjacent to each other in a predetermined direction are coupled to each other by a via conductor, whereby an antenna element is formed. Here, a retreat layout is provided such that the via conductor is positioned near a corner of the multilayer body, while a retreat layout is not provided at at least one of the other corners than the corner of the retreat layout.

Each insulative base is typically made of a resin or ceramic material. The coil pattern and via conductor are made of a metal material, such as copper. In general, metal materials undergo a small thermal deformation as compared with resin and ceramic materials. Therefore, in a compression and heating step which is part of the antenna module manufacturing process, stress is likely to occur at the location of the via conductor.

To increase the quantity of turns of the coil pattern, the gap between adjacent turns has been decreasing. In some cases, a base having a smaller thickness is used for decreasing the thickness of the entire module. Under such circumstances, the base is first softened in the heating step, and therefore, in some cases, strain or cracks occur in the base due to the via conductor which undergoes a small deformation. Further, thereafter, if the via conductor is softened to flow into the strain or cracks of the base, it can cause disconnection, or short circuit between adjacent turns.

SUMMARY OF THE INVENTION

Accordingly, preferred embodiments of the present invention provide an antenna module with higher reliability.

A 1st aspect of various preferred embodiments of the present invention is an antenna module including a multilayer body including a principal surface and being made of an insulative material; an IC chip provided on the multilayer body; and an antenna element coupled to the IC chip, wherein the antenna element includes a plurality of coil patterns arranged in a predetermined direction, and a plurality of via conductors electrically coupling together two of the plurality of coil patterns which are adjacent to each other in the predetermined direction, at least one of the plurality of coil patterns has a spiral shape, is wound three or more turns parallel or substantially parallel with an outer edge of the principal surface, one of the plurality of via conductors is joined to an outer end portion of the at least one coil pattern, and another one of the plurality of via conductors is joined to an inner end portion of the at least one coil pattern, and the at least one coil pattern at least includes a first partial pattern including the outer end portion, a second partial pattern extending parallel or substantially parallel with the first partial pattern and being adjacent to the first partial pattern with a first gap provided therebetween, and a third partial pattern extending parallel or substantially parallel with the second partial pattern and being adjacent to the second partial pattern with a second gap provided therebetween, the second gap being smaller than the first gap.

According to a 2nd aspect of various preferred embodiments of the present invention, in the 1st aspect, a wire width of the first partial pattern is greater than wire widths of the second partial pattern and the third partial pattern.

According to a 3rd aspect of various preferred embodiments of the present invention, in the 1st or 2nd aspect, the at least one coil pattern further includes a fourth partial pattern extending toward the outer end portion and being perpendicular or substantially perpendicular to the first partial pattern, and a wire width of the first partial pattern and a wire width of the fourth partial pattern are equal or substantially equal to each other.

According to a 4th aspect of various preferred embodiments of the present invention, in any of the 1st to 3rd aspects, in the at least one coil pattern, the via conductor joined to the outer end portion and the via conductor joined to the inner end portion are located in identical or substantially identical directions when viewed from a winding center of the spiral.

According to a 5th aspect of various preferred embodiments of the present invention, in any of the 1st to 4th aspects, the IC chip is mounted on the principal surface of the multilayer body, the antenna module further includes an overmold layer configured to overmold the IC chip mounted on the principal surface, and a surface of the overmold layer is attached to an object article.

According to a 6th aspect of various preferred embodiments of the present invention, in the 5th aspect, in the antenna element, a quantity of turns of a coil pattern which is relatively close to the object article is larger than a quantity of turns of a coil pattern which is relatively distant from the object article.

According to a 7th aspect of various preferred embodiments of the present invention, in the 5th aspect, in the antenna element, a quantity of turns of a coil pattern which is relatively close to the object article is smaller than a quantity of turns of a coil pattern which is relatively distant from the object article.

According to an 8th aspect of various preferred embodiments of the present invention, in any of the 5th to 7th aspects, a thickness along the predetermined direction of the overmold layer is greater than a distance between outermost coil patterns along the predetermined direction in the multilayer body.

According to a 9th aspect of various preferred embodiments of the present invention, in any of the 5th to 8th aspects, a dielectric constant of the overmold layer is smaller than a dielectric constant of the insulative multilayer body.

According to a 10th aspect of various preferred embodiments of the present invention, in any of the 1st to 9th aspects, the antenna element further includes a drawn-out conductor pattern drawn out from an innermost turn of the at least one coil pattern to a position of the inner end portion in a direction parallel or substantially parallel with the first partial pattern.

According to an 11th aspect of various preferred embodiments of the present invention, in the 10th aspect, the drawn-out conductor pattern is provided to each of one and the other of the two coil patterns which are adjacent to each other in the predetermined direction, and the drawn-out conductor pattern provided to the one coil pattern and the drawn-out conductor pattern provided to the other coil pattern are perpendicular or substantially perpendicular to each other.

According to a 12th aspect of various preferred embodiments of the present invention, in the 10th or 11th aspect, a wire width of the drawn-out conductor pattern is greater than a wire width of an innermost turn of the coil pattern.

According to a 13th aspect of various preferred embodiments of the present invention, in any of the 1st to 12th aspects, the antenna element includes at least three coil patterns arranged in the predetermined direction in the multilayer body and a plurality of via conductors coupling two coil patterns which are adjacent to each other in the predetermined direction, and in the two coil patterns which are adjacent to each other in the predetermined direction, positions of via conductors provided at outer end portions are coincident with each other, and positions of via conductors provided at inner end portions are coincident with each other, when viewed in plan from the predetermined direction.

According to a 14th aspect of various preferred embodiments of the present invention, in any of the 1st to 13th aspects, the plurality of coil patterns include at least a first partial pattern and a second partial pattern in which electric currents of opposite directions flow, and in each of the coil patterns, a quantity of the first partial pattern and a quantity of the second partial pattern are different from each other, and in the antenna element, a total quantity of the first partial pattern and a total quantity of the second partial pattern are equal to each other.

According to a 15th aspect of various preferred embodiments of the present invention, in any of the 1st to 13th aspects, the plurality of coil patterns at least include a first partial pattern and a second partial pattern in which electric currents of opposite directions flow, and in the antenna element, a total quantity of the first partial pattern and a total quantity of the second partial pattern are different from each other.

A 16th aspect of various preferred embodiments of the present invention is an antenna module including a multilayer body including a principal surface and being made of an insulative material; an IC chip mounted on the principal surface of the multilayer body; an antenna element coupled to the IC chip; and an overmold layer configured to overmold the IC chip, the antenna module being attached to an object article using a surface of the overmold layer, wherein the antenna element includes a plurality of coil patterns arranged in a predetermined direction, and a plurality of via conductors electrically coupling together two coil patterns which are adjacent to each other in the predetermined direction, and among the plurality of coil patterns, a quantity of turns of a coil pattern which is relatively close to the object article is larger than a quantity of turns of a coil pattern which is relatively distant from the object article.

According to a 17th aspect of various preferred embodiments of the present invention, in the 16th aspect, at least one of the plurality of coil patterns has a spiral shape and is wound three or more turns parallel or substantially parallel with an outer edge of the principal surface, one of the plurality of via conductors is joined to an outer end portion of the at least one coil pattern, and another one of the plurality of via conductors is joined to an inner end portion of the at least one coil pattern, and the at least one coil pattern at least includes a first partial pattern including the outer end portion, a second partial pattern extending parallel or substantially parallel with the first partial pattern and being adjacent to the first partial pattern with a first gap provided therebetween, and a third partial pattern extending parallel or substantially parallel with the second partial pattern and being adjacent to the second partial pattern with a second gap provided therebetween, the second gap being smaller than the first gap.

According to an 18th aspect of various preferred embodiments of the present invention, in the 17th aspect, a wire width of the first partial pattern is greater than wire widths of the second partial pattern and the third partial pattern.

According to a 19th aspect of various preferred embodiments of the present invention, in the 17th or 18th aspect, the at least one coil pattern further includes a fourth partial pattern extending toward the outer end portion and being perpendicular or substantially perpendicular to the first partial pattern, and a wire width of the first partial pattern and a wire width of the fourth partial pattern are equal or substantially equal to each other.

According to a 20th aspect of various preferred embodiments of the present invention, in any of the 17th to 19th aspects, in the at least one coil pattern, the via conductor joined to the outer end portion and the via conductor joined to the inner end portion are arranged in identical or substantially identical directions when viewed from a winding center of the spiral.

According to a 21st aspect of various preferred embodiments of the present invention, in any of the 16th to 20th aspects, a thickness along the predetermined direction of the overmold layer is greater than a distance between outermost coil patterns along the predetermined direction in the multilayer body.

According to a 22nd aspect of various preferred embodiments of the present invention, in any of the 16th to 21st aspects, a dielectric constant of the overmold layer is smaller than a dielectric constant of the insulative multilayer body.

According to a 23rd aspect of various preferred embodiments of the present invention, in any of the 16th to 22nd aspects, the antenna element further includes a drawn-out conductor pattern drawn out from an innermost turn of the at least one coil pattern to a position of the inner end portion in a direction parallel or substantially parallel with the first partial pattern.

According to a 24th aspect of various preferred embodiments of the present invention, in the 23rd aspect, the drawn-out conductor pattern is provided to each of one and the other of the two coil patterns which are adjacent to each other in the predetermined direction, and the drawn-out conductor pattern provided to the one coil pattern and the drawn-out conductor pattern provided to the other coil pattern are perpendicular or substantially perpendicular to each other.

According to a 25th aspect of various preferred embodiments of the present invention, in the 23rd or 24th aspect, a wire width of the drawn-out conductor pattern is greater than a wire width of an innermost turn of the coil pattern.

According to a 26th aspect of various preferred embodiments of the present invention, in any of the 16th to 25th aspects, the antenna element includes at least three coil patterns arranged in the predetermined direction in the multilayer body and a plurality of via conductors coupling two coil patterns which are adjacent to each other in the predetermined direction, and in the two coil patterns which are adjacent to each other in the predetermined direction, positions of via conductors provided at outer end portions are coincident with each other, and positions of via conductors provided at inner end portions are coincident with each other, when viewed in plan from the predetermined direction.

According to a 27th aspect of various preferred embodiments of the present invention, in any of the 16th to 26th aspects, the plurality of coil patterns at least include a first partial pattern and a second partial pattern in which electric currents of opposite directions flow, and in each of the coil patterns, a quantity of the first partial pattern and a quantity of the second partial pattern are different from each other, and in the antenna element, a total quantity of the first partial pattern and a total quantity of the second partial pattern are equal to each other.

According to a 28th aspect of various preferred embodiments of the present invention, in any of the 16th to 26th aspects, the plurality of coil patterns at least include a first partial pattern and a second partial pattern in which electric currents of opposite directions flow, and in the antenna element, a total quantity of the first partial pattern and a total quantity of the second partial pattern are different from each other.

A 29th aspect of various preferred embodiments of the present invention is an antenna module including a multilayer body including a principal surface and being made of an insulative material; an IC chip mounted on the principal surface of the multilayer body; an antenna element coupled to the IC chip; and an overmold layer configured to overmold the IC chip, the antenna module being attached to an object article using a surface of the overmold layer, wherein the antenna element includes a plurality of coil patterns arranged in a predetermined direction, and a plurality of via conductors electrically coupling together two coil patterns which are adjacent to each other in the predetermined direction, and among the plurality of coil patterns, a quantity of turns of a coil pattern which is relatively close to the object article is smaller than a quantity of turns of a coil pattern which is relatively distant from the object article.

According to a 30th aspect of various preferred embodiments of the present invention, in the 29th aspect, at least one of the plurality of coil patterns has a spiral shape and is wound three or more turns parallel or substantially parallel with an outer edge of the principal surface, one of the plurality of via conductors is joined to an outer end portion of the at least one coil pattern, and another one of the plurality of via conductors is joined to an inner end portion of the at least one coil pattern, and the at least one coil pattern at least includes a first partial pattern including the outer end portion, a second partial pattern extending parallel or substantially parallel with the first partial pattern and being adjacent to the first partial pattern with a first gap provided therebetween, and a third partial pattern extending parallel with the second partial pattern and being adjacent to the second partial pattern with a second gap provided therebetween, the second gap being smaller than the first gap.

According to a 31st aspect of various preferred embodiments of the present invention, in the 30th aspect, a wire width of the first partial pattern is greater than wire widths of the second partial pattern and the third partial pattern.

According to a 32nd aspect of various preferred embodiments of the present invention, in the 30th or 31st aspect, the at least one coil pattern further includes a fourth partial pattern extending toward the outer end portion and being perpendicular or substantially perpendicular to the first partial pattern, and a wire width of the first partial pattern and a wire width of the fourth partial pattern are equal or substantially equal to each other.

According to a 33rd aspect of various preferred embodiments of the present invention, in any of the 30th to 32nd aspects, in the at least one coil pattern, the via conductor joined to the outer end portion and the via conductor joined to the inner end portion are arranged in identical or substantially identical directions when viewed from a winding center of the spiral.

According to a 34th aspect of various preferred embodiments of the present invention, in any of the 29th to 33rd aspects, a thickness along the predetermined direction of the overmold layer is greater than a distance between outermost coil patterns along the predetermined direction in the multilayer body.

According to a 35th aspect of various preferred embodiments of the present invention, in any of the 29th to 34th aspects, a dielectric constant of the overmold layer is smaller than a dielectric constant of the insulative multilayer body.

According to a 36th aspect of various preferred embodiments of the present invention, in any of the 29th to 35th aspects, the antenna element further includes a drawn-out conductor pattern drawn out from an innermost turn of the at least one coil pattern to a position of the inner end portion in a direction parallel with the first partial pattern.

According to a 37th aspect of various preferred embodiments of the present invention, in the 36th aspect, the drawn-out conductor pattern is provided to each of one and the other of the two coil patterns which are adjacent to each other in the predetermined direction, and the drawn-out conductor pattern provided to the one coil pattern and the drawn-out conductor pattern provided to the other coil pattern are perpendicular or substantially perpendicular to each other.

According to a 38th aspect of various preferred embodiments of the present invention, in the 36th or 37th aspect, a wire width of the drawn-out conductor pattern is greater than a wire width of an innermost turn of the coil pattern.

According to a 39th aspect of various preferred embodiments of the present invention, in any of the 29th to 38th aspects, the antenna element includes at least three coil patterns arranged in the predetermined direction in the multilayer body and a plurality of via conductors coupling two coil patterns which are adjacent to each other in the predetermined direction, and in the two coil patterns which are adjacent to each other in the predetermined direction, positions of via conductors provided at outer end portions are coincident with each other, and positions of via conductors provided at inner end portions are coincident with each other, when viewed in plan from the predetermined direction.

According to a 40th aspect of various preferred embodiments of the present invention, in any of the 29th to 39th aspects, the plurality of coil patterns at least include a first partial pattern and a second partial pattern in which electric currents of opposite directions flow, and in each of the coil patterns, a quantity of the first partial pattern and a quantity of the second partial pattern are different from each other, and in the antenna element, a total quantity of the first partial pattern and a total quantity of the second partial pattern are equal to each other.

According to a 41st aspect of various preferred embodiments of the present invention, in any of the 29th to 39th aspects, the plurality of coil patterns at least include a first partial pattern and a second partial pattern in which electric currents of opposite directions flow, and in the antenna element, a total quantity of the first partial pattern and a total quantity of the second partial pattern are different from each other.

A 42nd aspect of various preferred embodiments of the present invention is an antenna module including a multilayer body including a principal surface and being made of an insulative material; an IC chip mounted on the principal surface of the multilayer body; an antenna element coupled to the IC chip; and an overmold layer configured to overmold the IC chip, the antenna module being attached to an object article using a surface of the overmold layer, wherein the antenna element includes a plurality of coil patterns arranged in a predetermined direction, and a plurality of via conductors electrically coupling together two coil patterns which are adjacent to each other in the predetermined direction, and a thickness along the predetermined direction of the overmold layer is greater than a distance between outermost coil patterns along the predetermined direction in the multilayer body.

According to a 43rd aspect of various preferred embodiments of the present invention, in the 42nd aspect, at least one of the plurality of coil patterns has a spiral shape and is wound three or more turns parallel or substantially parallel with an outer edge of the principal surface, one of the plurality of via conductors is joined to an outer end portion of the at least one coil pattern, and another one of the plurality of via conductors is joined to an inner end portion of the at least one coil pattern, and the at least one coil pattern at least includes a first partial pattern including the outer end portion, a second partial pattern extending parallel or substantially parallel with the first partial pattern and being adjacent to the first partial pattern with a first gap provided therebetween, and a third partial pattern extending parallel or substantially parallel with the second partial pattern and being adjacent to the second partial pattern with a second gap provided therebetween, the second gap being smaller than the first gap.

According to a 44th aspect of various preferred embodiments of the present invention, in the 43rd aspect, a wire width of the first partial pattern is greater than wire widths of the second partial pattern and the third partial pattern.

According to a 45th aspect of various preferred embodiments of the present invention, in the 43rd or 44th aspect, the at least one coil pattern further includes a fourth partial pattern extending toward the outer end portion and being perpendicular or substantially perpendicular to the first partial pattern, and a wire width of the first partial pattern and a wire width of the fourth partial pattern are equal or substantially equal to each other.

According to a 46th aspect of various preferred embodiments of the present invention, in any of the 43rd to 45th aspects, in the at least one coil pattern, the via conductor joined to the outer end portion and the via conductor joined to the inner end portion are arranged in identical or substantially identical directions when viewed from a winding center of the spiral.

According to a 47th aspect of various preferred embodiments of the present invention, in any of the 43rd to 46th aspects, a thickness along the predetermined direction of the overmold layer is greater than a distance between outermost coil patterns along the predetermined direction in the multilayer body.

According to a 48th aspect of various preferred embodiments of the present invention, in any of the 42nd to 47th aspects, a dielectric constant of the overmold layer is smaller than a dielectric constant of the insulative multilayer body.

According to a 49th aspect of various preferred embodiments of the present invention, in any of the 42nd to 48th aspects, the antenna element further includes a drawn-out conductor pattern drawn out from an innermost turn of the at least one coil pattern to a position of the inner end portion in a direction parallel with the first partial pattern.

According to a 50th aspect of various preferred embodiments of the present invention, in the 49th aspect, the drawn-out conductor pattern is provided to each of one and the other of the two coil patterns which are adjacent to each other in the predetermined direction, and the drawn-out conductor pattern provided to the one coil pattern and the drawn-out conductor pattern provided to the other coil pattern are perpendicular or substantially perpendicular to each other.

According to a 51st aspect of various preferred embodiments of the present invention, in the 49th or 50th aspect, a wire width of the drawn-out conductor pattern is greater than a wire width of an innermost turn of the coil pattern.

According to a 52nd aspect of various preferred embodiments of the present invention, in any of the 42nd to 51st aspects, the antenna element includes at least three coil patterns arranged in the predetermined direction in the multilayer body and a plurality of via conductors coupling two coil patterns which are adjacent to each other in the predetermined direction, and in the two coil patterns which are adjacent to each other in the predetermined direction, positions of via conductors provided at outer end portions are coincident with each other, and positions of via conductors provided at inner end portions are coincident with each other, when viewed in plan from the predetermined direction.

According to a 53rd aspect of various preferred embodiments of the present invention, in any of the 42nd to 52nd aspects, the plurality of coil patterns at least include a first partial pattern and a second partial pattern in which electric currents of opposite directions flow, and in each of the coil patterns, a quantity of the first partial pattern and a quantity of the second partial pattern are different from each other, and in the antenna element, a total quantity of the first partial pattern and a total quantity of the second partial pattern are equal to each other.

According to a 54th aspect of various preferred embodiments of the present invention, in any of the 42nd to 52nd aspects, the plurality of coil patterns at least include a first partial pattern and a second partial pattern in which electric currents of opposite directions flow, and in the antenna element, a total quantity of the first partial pattern and a total quantity of the second partial pattern are different from each other.

A 55th aspect of various preferred embodiments of the present invention is an antenna module including a multilayer body including a principal surface and being made of an insulative material; an IC chip provided on the multilayer body; and an antenna element coupled to the IC chip, wherein the antenna element includes a plurality of coil patterns arranged in a predetermined direction, and a plurality of via conductors electrically coupling together two coil patterns which are adjacent to each other in the predetermined direction, the plurality of coil patterns at least include a first partial pattern and a second partial pattern in which electric currents of opposite directions flow, and in each of the coil patterns, a quantity of the first partial pattern and a quantity of the second partial pattern are different from each other, and in the antenna element, a total quantity of the first partial pattern and a total quantity of the second partial pattern are equal to each other.

According to a 56th aspect of various preferred embodiments of the present invention, in the 55th aspect, at least one of the plurality of coil patterns has a spiral shape and is wound three or more turns parallel or substantially parallel with an outer edge of the principal surface, one of the plurality of via conductors is joined to an outer end portion of the at least one coil pattern, and another one of the plurality of via conductors is joined to an inner end portion of the at least one coil pattern, and the at least one coil pattern at least includes a first partial pattern including the outer end portion, a second partial pattern extending parallel or substantially parallel with the first partial pattern and being adjacent to the first partial pattern with a first gap provided therebetween, and a third partial pattern extending parallel or substantially parallel with the second partial pattern and being adjacent to the second partial pattern with a second gap provided therebetween, the second gap being smaller than the first gap.

According to a 57th aspect of various preferred embodiments of the present invention, in the 56th aspect, a wire width of the first partial pattern is greater than wire widths of the second partial pattern and the third partial pattern.

According to a 58th aspect of various preferred embodiments of the present invention, in the 56th or 57th aspect, the at least one coil pattern further includes a fourth partial pattern extending toward the outer end portion and being perpendicular or substantially perpendicular to the first partial pattern, and a wire width of the first partial pattern and a wire width of the fourth partial pattern are equal or substantially equal to each other.

According to a 59th aspect of various preferred embodiments of the present invention, in any of the 56th to 58th aspects, in the at least one coil pattern, the via conductor joined to the outer end portion and the via conductor joined to the inner end portion are arranged in identical or substantially identical directions when viewed from a winding center of the spiral.

According to a 60th aspect of various preferred embodiments of the present invention, in any of the 56th to 59th aspects, the IC chip is mounted on the principal surface of the multilayer body, the antenna module further includes an overmold layer configured to overmold the IC chip mounted on the principal surface, and a surface of the overmold layer is attached to an object article.

According to a 61st aspect of various preferred embodiments of the present invention, in the 60th aspect, in the antenna element, a quantity of turns of a coil pattern which is relatively close to the object article is larger than a quantity of turns of a coil pattern which is relatively distant from the object article.

According to a 62nd aspect of various preferred embodiments of the present invention, in the 60th aspect, in the antenna element, a quantity of turns of a coil pattern which is relatively close to the object article is smaller than a quantity of turns of a coil pattern which is relatively distant from the object article.

According to a 63rd aspect of various preferred embodiments of the present invention, in any of the 60th to 62nd aspects, a thickness along the predetermined direction of the overmold layer is greater than a distance between outermost coil patterns along the predetermined direction in the multilayer body.

According to a 64th aspect of various preferred embodiments of the present invention, in any of the 60th to 63rd aspects, a dielectric constant of the overmold layer is smaller than a dielectric constant of the insulative multilayer body.

According to a 65th aspect of various preferred embodiments of the present invention, in any of the 56th to 64th aspects, the antenna element further includes a drawn-out conductor pattern drawn out from an innermost turn of the at least one coil pattern to a position of the inner end portion in a direction parallel with the first partial pattern.

According to a 66th aspect of various preferred embodiments of the present invention, in the 65th aspect, the drawn-out conductor pattern is provided to each of one and the other of the two coil patterns which are adjacent to each other in the predetermined direction, and the drawn-out conductor pattern provided to the one coil pattern and the drawn-out conductor pattern provided to the other coil pattern are perpendicular or substantially perpendicular to each other.

According to a 67th aspect of various preferred embodiments of the present invention, in the 65th or 66th aspect, a wire width of the drawn-out conductor pattern is greater than a wire width of an innermost turn of the coil pattern.

According to a 68th aspect of various preferred embodiments of the present invention, in any of the 55th to 67th aspects, the antenna element includes at least three coil patterns arranged in the predetermined direction in the multilayer body and a plurality of via conductors coupling two coil patterns which are adjacent to each other in the predetermined direction, and in the two coil patterns which are adjacent to each other in the predetermined direction, positions of via conductors provided at outer end portions are coincident with each other, and positions of via conductors provided at inner end portions are coincident with each other, when viewed in plan from the predetermined direction.

A 69th aspect of various preferred embodiments of the present invention is an antenna module including a multilayer body including a principal surface and being made of an insulative material; an IC chip provided on the multilayer body; and an antenna element coupled to the IC chip, wherein the antenna element includes a plurality of coil patterns arranged in a predetermined direction, and a plurality of via conductors electrically coupling together two coil patterns which are adjacent to each other in the predetermined direction, the plurality of coil patterns at least include a first partial pattern and a second partial pattern in which electric currents of opposite directions flow, and in each of the coil patterns, a quantity of the first partial pattern and a quantity of the second partial pattern are different from each other, and in the antenna element, a total quantity of the first partial pattern and a total quantity of the second partial pattern are different from each other.

According to a 70th aspect of various preferred embodiments of the present invention, in the 69th aspect, at least one of the plurality of coil patterns has a spiral shape and is wound three or more turns parallel or substantially parallel with an outer edge of the principal surface, one of the plurality of via conductors is joined to an outer end portion of the at least one coil pattern, and another one of the plurality of via conductors is joined to an inner end portion of the at least one coil pattern, and the at least one coil pattern at least includes a first partial pattern including the outer end portion, a second partial pattern extending parallel or substantially parallel with the first partial pattern and being adjacent to the first partial pattern with a first gap provided therebetween, and a third partial pattern extending parallel or substantially parallel with the second partial pattern and being adjacent to the second partial pattern with a second gap provided therebetween, the second gap being smaller than the first gap.

According to a 71st aspect of various preferred embodiments of the present invention, in the 70th aspect, a wire width of the first partial pattern is greater than wire widths of the second partial pattern and the third partial pattern.

According to a 72nd aspect of various preferred embodiments of the present invention, in the 70th or 71st aspect, the at least one coil pattern further includes a fourth partial pattern extending toward the outer end portion and being perpendicular or substantially perpendicular to the first partial pattern, and a wire width of the first partial pattern and a wire width of the fourth partial pattern are equal or substantially equal to each other.

According to a 73rd aspect of various preferred embodiments of the present invention, in any of the 70th to 72nd aspects, in the at least one coil pattern, the via conductor joined to the outer end portion and the via conductor joined to the inner end portion are arranged in identical or substantially identical directions when viewed from a winding center of the spiral.

According to a 74th aspect of various preferred embodiments of the present invention, in any of the 70th to 73rd aspects, the IC chip is mounted on the principal surface of the multilayer body, the antenna module further includes an overmold layer configured to overmold the IC chip mounted on the principal surface, and a surface of the overmold layer is attached to an object article.

According to a 75th aspect of various preferred embodiments of the present invention, in the 74th aspect, in the antenna element, a quantity of turns of a coil pattern which is relatively close to the object article is larger than a quantity of turns of a coil pattern which is relatively distant from the object article.

According to a 76th aspect of various preferred embodiments of the present invention, in the 74th aspect, in the antenna element, a quantity of turns of a coil pattern which is relatively close to the object article is smaller than a quantity of turns of a coil pattern which is relatively distant from the object article.

According to a 77th aspect of various preferred embodiments of the present invention, in any of the 74th to 76th aspects, a thickness along the predetermined direction of the overmold layer is greater than a distance between outermost coil patterns along the predetermined direction in the multilayer body.

According to a 78th aspect of various preferred embodiments of the present invention, in any of the 74th to 77th aspects, a dielectric constant of the overmold layer is smaller than a dielectric constant of the insulative multilayer body.

According to a 79th aspect of various preferred embodiments of the present invention, in any of the 70th to 78th aspects, the antenna element further includes a drawn-out conductor pattern drawn out from an innermost turn of the at least one coil pattern to a position of the inner end portion in a direction parallel with the first partial pattern.

According to an 80th aspect of various preferred embodiments of the present invention, in the 79th aspect, the drawn-out conductor pattern is provided to each of one and the other of the two coil patterns which are adjacent to each other in the predetermined direction, and the drawn-out conductor pattern provided to the one coil pattern and the drawn-out conductor pattern provided to the other coil pattern are perpendicular to each other.

According to an 81st aspect of various preferred embodiments of the present invention, in the 79th or 80th aspect, a wire width of the drawn-out conductor pattern is greater than a wire width of an innermost turn of the coil pattern.

According to an 82nd aspect of various preferred embodiments of the present invention, in any of the 70th to 81st aspects, the antenna element includes at least three coil patterns arranged in the predetermined direction in the multilayer body and a plurality of via conductors coupling two coil patterns which are adjacent to each other in the predetermined direction, and in the two coil patterns which are adjacent to each other in the predetermined direction, positions of via conductors provided at outer end portions are coincident with each other, and positions of via conductors provided at inner end portions are coincident with each other, when viewed in plan from the predetermined direction.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 4 is a top view showing a coil pattern of the first layer from the bottom of FIG. 3.

DETAILED DESCRIPTION OF THE PREFERRED EMBODIMENTS

As a preliminary matter, the x-axis, y-axis, and z-axis which are shown in some drawings are described. The x-axis, y-axis, and z-axis are perpendicular to one another and represent the left-to-right direction, front-to-rear direction, and vertical direction of the antenna module. The z-axis further represents the stacking direction of a plurality of insulative bases.

Figure 1:
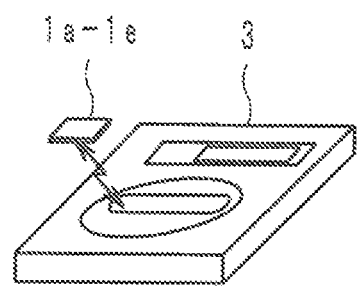
FIG. 1 is a schematic diagram showing a configuration of a RFID tag system including an antenna module according to various preferred embodiments of the present invention.
Figure 2:
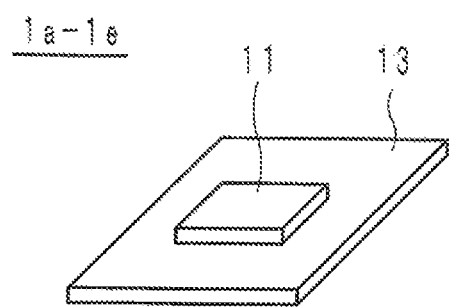
FIG. 2 is a perspective view showing the exterior of each antenna modules.

In FIG. 1, the RFID system preferably uses the 13.56 MHz band, for example. The RFID system includes a RFID tag 1a-1e according to any of the first to fifth preferred embodiments of the present invention, and a reader/writer unit (hereinafter, "RWU") 3 configured to write and read data to and from the RFID tags 1a-1e.

The RFID tag 1a is one example of an antenna module. As shown in FIG. 2 to FIG. 6, the RFID tag 1a generally includes an IC chip 11, a multilayer body 13, and an antenna element 15.

The IC chip 11 is mounted to a principal surface 33e, which will be described later, by flip-chip bonding, for example. The IC chip 11 includes terminal electrodes 21a, 21b that are coupled to a resonance circuit which will be described later.

The IC chip 11 preferably is configured to store ID information in the IC chip 11 and control short-range wireless communication with the RWU 3 (see FIG. 1). A specific example of the signal reception process is such that the IC chip 11 receives a high frequency signal from the RWU 3 via the resonance circuit which will be described later and reproduces ID information. The IC chip 11 then stores the reproduced ID information in the IC chip 11. A specific example of the signal transmission process is such that the IC chip 11 produces a high frequency signal whose carrier wave is digitally modulated with the ID information stored in the IC chip 11, and then outputs the high frequency signal to the resonance circuit which will be described later.

Figure 3:
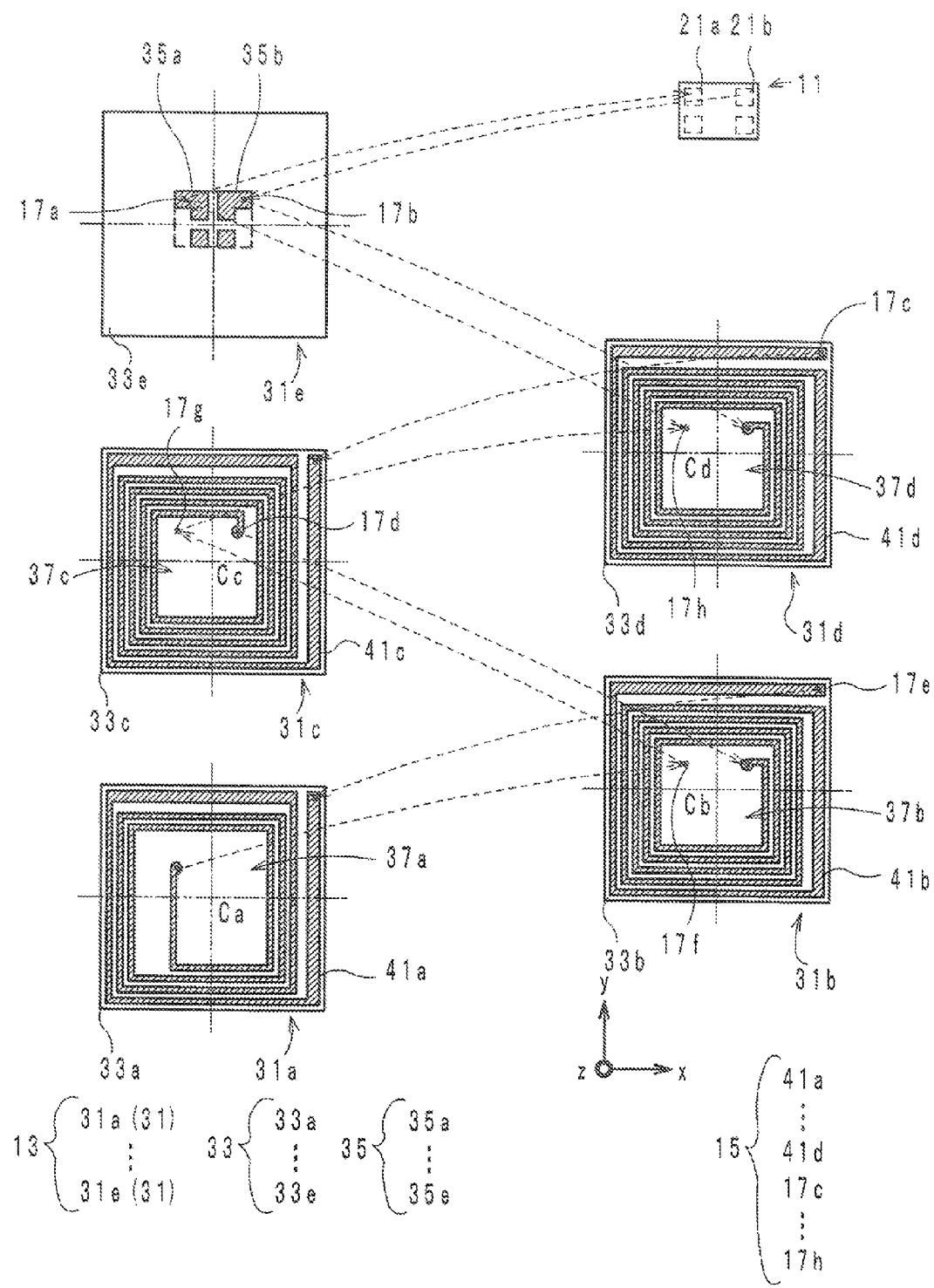
FIG. 3 is a top view of respective layers which are constituents of an antenna module according to a first preferred embodiment of the present invention.

The multilayer body 13 preferably includes a plurality of insulative bases 31. Examples of the plurality of insulative bases 31 shown in FIG. 3 are five bases 31a to 31e. These bases 31a to 31e are stacked up in this order in the positive direction of the z-axis, i.e., from the bottom to the top.

In the present preferred embodiment, the insulative bases 31a to 31e are made of a resin material which is electrically insulative and flexible. A typical example of the resin material is a resin film of polyethylene telephthalate (PET), polyvinyl chloride (PVC), polyimide, polycarbonate, or an epoxy resin. Note that the bases 31a to 31e may be made of a ceramic material. In the present preferred embodiment, the bases 31a to 31e are sheets whose principal surfaces 33a to 33e have a rectangular or substantially rectangular shape when viewed in plan from the z-axis direction. The bases 31 preferably have a size of about 3.0 mm, for example, in the x-axis direction and the y-axis direction. The bases 31 preferably have a thickness of about 0.3 mm to about 0.5 mm in the z-axis direction, for example.

At a central portion of the principal surface 33e of the base 31e, land electrodes 35a, 35b are provided for mounting of the IC chip 11. The terminal electrodes 21a, 21b are joined to the land electrodes 35a, 35b. Immediately below the land electrodes 35a, 35b, via conductors 17a, 17b are provided. The via conductors 17a, 17b are each preferably formed by filling a hole penetrating through the base 31e in the z-axis direction with a metal paste containing tin, for example, and heating and compressing the metal paste. The thus-formed via conductor 17a is joined to the land electrode 35a and the via conductor 17h formed in the base 31d, such that these elements are electrically coupled together.

In the bases 31a to 31d, opening regions 37a to 37d are defined for coil patterns 41a to 41d which are constituents of the antenna element 15. The opening regions 37a to 37d are regions provided at the central portions of the bases 31a to 31d, respectively, in which the coil patterns 41a to 41d are not provided.

On the bases 31a to 31d, the coil patterns 41a to 41d are provided. The coil patterns 41a to 41d are made of an electrically-conductive material (typically, copper). The coil patterns 41a to 41d have a shape like a spiral coil which is wound three or more turns in the shape of a spiral on the principal surfaces 33a to 33d, around the centers Ca to Cd of the principal surfaces 33a to 33d which serve as the winding centers. Here, the centers of the winding centers Ca to Cd are indicated by the intersection of two two-dot chain lines in FIG. 3. Hereinafter, the coil patterns 41a to 41d are described with reference to FIG. 4 to FIG. 6.

As shown in FIG. 4, the coil pattern 41a includes a drawn-out conductor pattern 43a on the principal surface 33a. The drawn-out conductor pattern 43a extends in the negative direction of the y-axis from the same position as the via conductor 17a to an outer edge of the opening region 37a (indicated by a broken line box) when viewed in plan from the z-axis direction. From this position, the coil pattern 41a turns, for example, anticlockwise over the drawing sheet of FIG. 4 into the shape of a spiral, parallel or substantially parallel with the outer edges of the principal surface 33a. More specifically, the coil pattern 41a turns from the perimeter edges of the opening region 37a toward the perimeter edges of the principal surface 33a while the direct distance from the winding center Ca increases. The coil pattern 41a terminates at one of the corners of the principal surface 33a. Here, this corner is one of the four corners of the principal surface 33a which is the closest to a half line starting from the winding center Ca and passing through the position of the via conductor 17b when viewed in plan from the z-axis direction. Note that, hereinafter, the start position and the terminal position of the coil pattern 41a are referred to as "inner end portion Sa" and "outer end portion Ea" of the coil pattern 41a, respectively.

The coil pattern 41a includes a first partial pattern 45a, a second partial pattern 47a, a third partial pattern 49a, and a fourth partial pattern 411a. The first partial pattern 45a is a pattern portion of the coil pattern 41a which is in the form of a line segment passing through the outer end portion Ea and extending parallel or substantially parallel with the y-axis. The first partial pattern 45a and the fourth partial pattern 411a have the largest wire width in the coil pattern 41a. The second partial pattern 47a is a pattern portion of the coil pattern 41a which is in the form of a line segment lying adjacent to the first partial pattern 45a at the negative direction side of the x-axis with a gap Δ1 therebetween and extending parallel with the y-axis. The third partial pattern 49a is a pattern portion of the coil pattern 41a which is in the form of a line segment lying adjacent to the second partial pattern 47a at the negative direction side of the x-axis with a gap Δ2 (Δ2<Δ1) therebetween and extending parallel or substantially parallel with the y-axis. Note that the gap between two partial patterns which are parallel with the y-axis is preferably Δ2 except for the gap Δ1 between the first partial pattern 45a and the second partial pattern 47a.

The fourth partial pattern 411a is a portion of the coil pattern 41a extending perpendicular or substantially perpendicular to the first partial pattern 45a toward the outer end portion Ea. Here, the wire width of the fourth partial pattern 411a is equal or substantially equal to that of the first partial pattern 45a.

Figure 5:
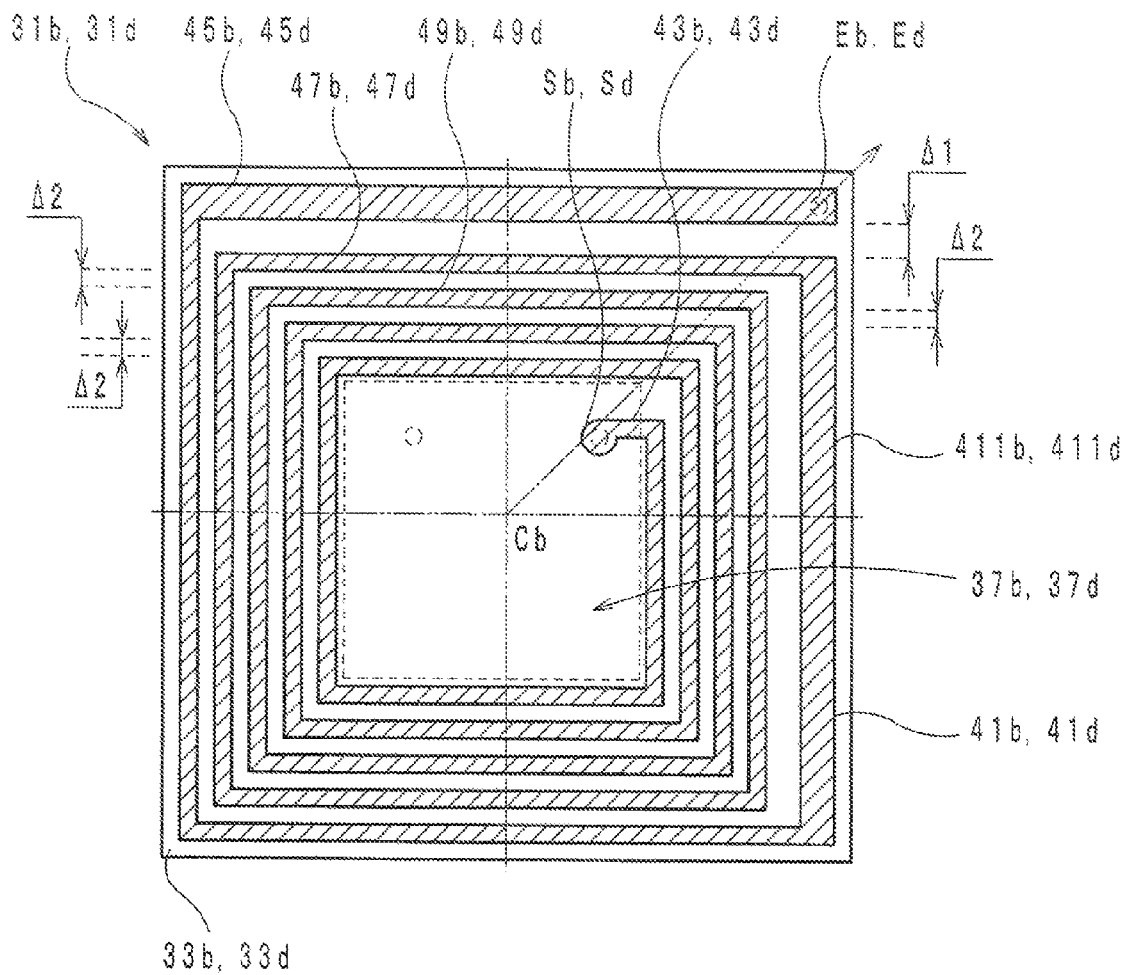
FIG. 5 is a top view showing a coil pattern of the second and fourth layers from the bottom of FIG. 3.

As shown in FIG. 5, the coil pattern 41b includes a drawn-out conductor pattern 43b on the principal surface 33b. The drawn-out conductor pattern 43b extends in the positive direction of the x-axis from the same position as the via conductor 17b to an outer edge of the opening region 37b (indicated by a broken line box) when viewed in plan from the z-axis direction. From this position, the coil pattern 41b turns, for example, clockwise over the drawing sheet of FIG. 5 into the shape of a spiral, parallel or substantially parallel with the outer edges of the principal surface 33b. More specifically, the coil pattern 41b turns from the perimeter edges of the opening region 37b toward the perimeter edges of the principal surface 33b while the direct distance from the winding center Cb increases. The coil pattern 41b terminates at one of the corners of the principal surface 33b. Here, this corner is one of the four corners of the principal surface 33b which is the closest to a half line starting from the winding center Cb and passing through the position of the via conductor 17b when viewed in plan from the z-axis direction. Note that, hereinafter, the start position and the terminal position of the coil pattern 41b are referred to as "inner end portion Sb" and "outer end portion Eb" of the coil pattern 41b, respectively.

The coil pattern 41b includes a first partial pattern 45b, a second partial pattern 47b, a third partial pattern 49b, and a fourth partial pattern 411b. The first partial pattern 45b is a pattern portion of the coil pattern 41b which is in the form of a line segment passing through the outer end portion Eb and extending parallel or substantially parallel with the x-axis. The first partial pattern 45b and the fourth partial pattern 411b have the largest wire width in the coil pattern 41b. The second partial pattern 47b is a pattern portion of the coil pattern 41b which is in the form of a line segment lying adjacent to the first partial pattern 45b at the negative direction side of the y-axis with a gap Δ1 therebetween and extending parallel or substantially parallel with the x-axis. The third partial pattern 49b is a pattern portion of the coil pattern 41b which is in the form of a line segment lying adjacent to the second partial pattern 47b at the negative direction side of the y-axis with a gap Δ2 (Δ2<Δ1) therebetween and extending parallel or substantially parallel with the x-axis. Note that the gap between two partial patterns which are parallel or substantially parallel with the y-axis is preferably Δ2 except for the gap Δ1 between the first partial pattern 45b and the second partial pattern 47b.

The fourth partial pattern 411b is a portion of the coil pattern 41b extending perpendicular or substantially perpendicular to the first partial pattern 45b toward the outer end portion Eb. Here, the wire width of the fourth partial pattern 411b is equal or substantially equal to that of the first partial pattern 45b.

Figure 6:
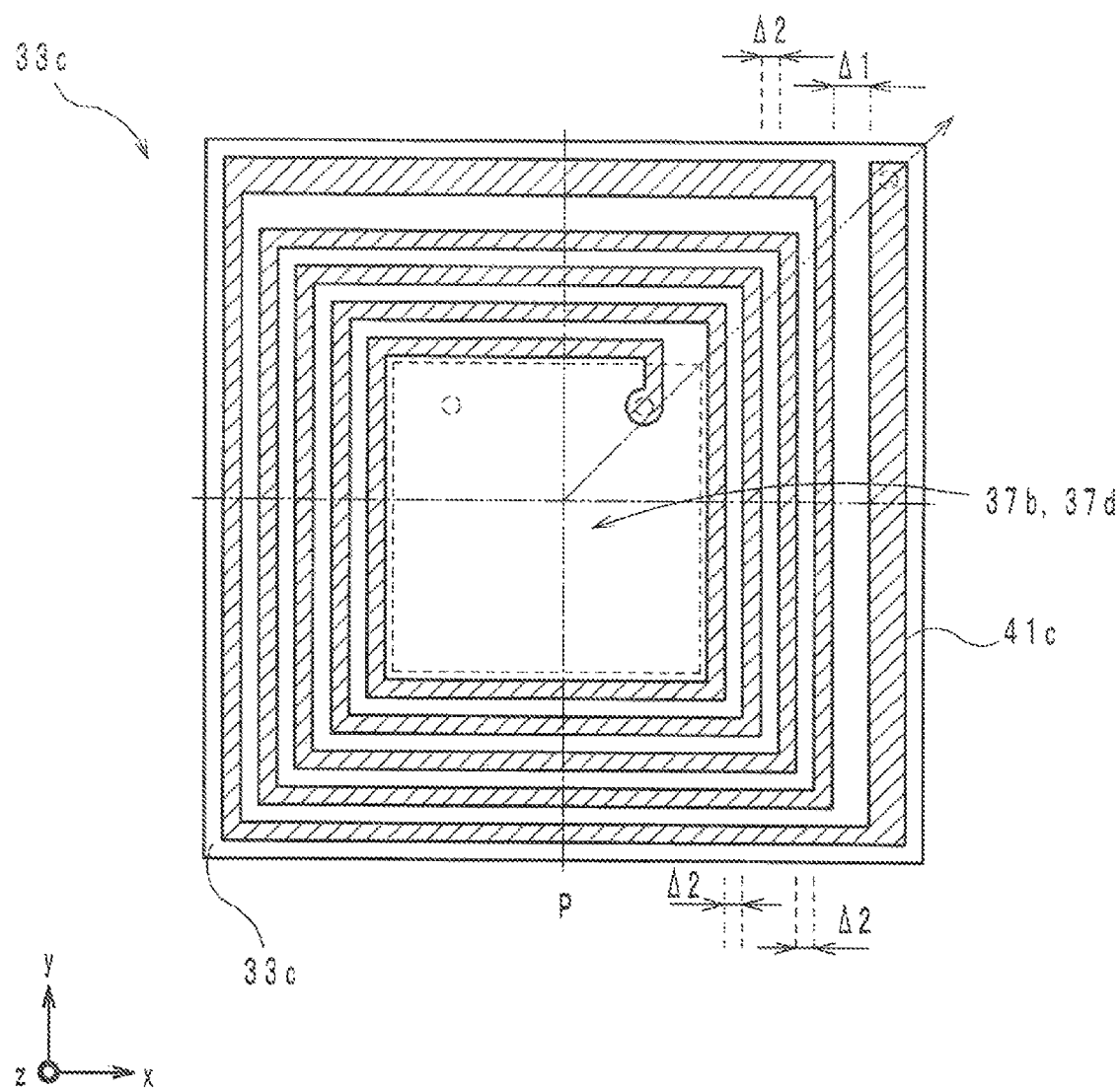
FIG. 6 is a top view showing a coil pattern of the third layer from the bottom of FIG. 3.

FIG. 6 shows a coil pattern 41c. The shape of the coil pattern 41c is equal or substantially equal to that of the coil pattern 41b which is rotated anticlockwise by 90° and then symmetrically shifted with respect to a reference plane P. Here, the reference plane P is a plane which passes through the winding center Cb and which is parallel to the yz plane. From the above viewpoint, detailed description of the shape of the coil pattern 41c is omitted. Since the shape of the coil pattern 41d is equal or substantially equal to that of the coil pattern 41b, detailed description thereof is omitted.

Now, see again FIG. 3. The antenna element 15 includes a plurality of via conductors 17 in addition to the above-described coil patterns 41a to 41d. As the plurality of via conductors 17, via conductors 17c to 17h are shown in FIG. 3, in addition to the above-described via conductors 17a, 17b. The via conductors 17c to 17h are also preferably formed by the same manner as that of the via conductors 17a, 17b, for example. The via conductor 17c penetrates through the base 31d in the z-axis direction and connects with the outer end portion Ed of the coil pattern 41d and the outer end portion Ec of the coil pattern 41c, thus electrically coupling these elements together. The via conductor 17d penetrates through the base 31c in the z-axis direction and connects with the inner end portion Sc of the coil pattern 41c and the inner end portion Sb of the coil pattern 41b, thus electrically coupling these elements together. The via conductor 17e penetrates through the base 31b in the z-axis direction and is joined to the outer end portion Ea of the coil pattern 41b and the outer end portion Ea of the coil pattern 41a, thus electrically coupling these elements together. The via conductor 17f penetrates through the base 31b in the z-axis direction and is joined to the coil pattern 41a and the via conductor 17g, thus electrically coupling these elements together. The via conductor 17g penetrates through the base 31c in the z-axis direction and is joined to the via conductors 17f, 17h, thus electrically coupling these elements together. Here, the via conductors 17c, 17e preferably are provided at the same position when viewed in plan from the z-axis direction.

The above-described coil patterns 41a to 41d are sequentially electrically coupled using the plurality of via conductors 17, such that the antenna element 15 is configured. The antenna element 15 and an unshown capacitor are coupled in parallel to the IC chip 11 and define a parallel resonance circuit. Between opposite ends of the parallel resonance circuit, an induced electromotive force is produced based on a radiated magnetic field of the RWU 3 if the IC chip 11 carries out a signal reception process. On the other hand, if the IC chip 11 carries out a signal transmission process, the parallel resonance circuit resonates based on a high frequency signal supplied from the IC chip 11 and magnetically couples to the antenna of the RWU 3.

Next, a non-limiting example of a manufacturing method of the RFID tag 1 is described. Hereinafter, a manufacturing process of a single piece of the RFID tag 1 is described although, in actuality, large-surface insulative bases are stacked up and cut, such that a large quantity of pieces of the RFID tag 1 are simultaneously manufactured.

Step (1): Firstly, a required quantity of large-surface insulative bases are prepared whose surfaces are generally entirely covered with copper foil. Each of the large-surface insulative bases is any of the bases 31a to 31e after completion of the RFID tag 1.

Step (2): Subsequent to Step (1), the coil pattern 41a is photolithographically formed on the surface of the large-surface insulative base. More specifically, firstly, a resist which has the same shape as that of the coil pattern 41a is printed on the copper foil of the respective large-surface insulative base. Thereafter, etching is performed on the copper foil such that exposed copper foil portions which are not covered with the resist are removed. Thereafter, the resist is removed. As a result, the coil pattern 41a is formed on the surface of the large-surface insulative base. Note that, on the other large-surface insulative bases, any of the coil patterns 41b to 41d or a pair of land electrodes 35a, 35b is formed in the same way as that described above.

Step (3): Subsequent to Step (2), in each of the large-surface insulative bases, the positions at which the via conductors 17 are to be formed are irradiated with a laser beam at the other surface side (i.e., at the surface side on which the pattern is not formed), such that through holes are formed. Thereafter, a metal paste is filled up into each of the formed through holes. The metal paste is made of, for example, a metal whose main constituents are tin and silver, or an alloy thereof.

Step (4): Subsequent to Step (3), the large-surface insulative bases which are to be the bases 31a to 31e are stacked up in this order from the bottom to the top. Thereafter, heat and pressure are applied onto the stacked insulative bases from both the top and the bottom. By the application of pressure and heat, the large-surface insulative bases are softened and bonded by compression into an integral form, while the metal paste in the through holes is solidified, such that the via conductors 17a to 17h are formed.

Step (5): After the compression and heating step of Step (4) is finished, the IC chips 11 are mounted to the integrated insulative bases, and the resultant structure is cut into pieces of a predetermined size. As a result, the RFID tag 1 in which the IC chip 11 is mounted and the antenna element 15 is incorporated (see FIG. 2) is completed.

As described above, in the RFID tag 1 of the present preferred embodiment, the via conductors 17c, 17e are formed at generally coincident positions when viewed in plan from the z-axis direction. Here, comparing the via conductors 17 and the bases 31, the via conductors 17 have a higher melting point. Therefore, in the compression and heating step in the above-described manufacturing process, stress is likely to occur at the positions where the via conductors are formed. However, in the present preferred embodiment, $\Delta 1 > \Delta 2$ holds, and the gap is larger in the vicinity of the via conductors 17c, 17e. Therefore, the stress occurring in the via conductors 17c, 17e is released to the relatively large gap. This arrangement significantly reduces or prevents the occurrence of strain or cracks in the bases 31 and enables providing an antenna module which has higher reliability than conventional antenna modules.

The first partial pattern 45a extending to the outer end portion Ea and the fourth partial pattern 411a are portions which have the largest wire width in the coil pattern 41a. Likewise, the first partial patterns 45b to 45d and the fourth partial patterns 411b to 411d are portions which have the largest wire width in the coil patterns 41b to 41d. Therefore, for example, the interlayer capacitance value occurring between the first partial pattern 45a and the fourth partial pattern 411b is increased. Accordingly, the self-resonant frequency of the antenna element 15 is decreased, and the inductance value of the antenna element 15 is reduced. Further, since the resistance value of each coil pattern 41 is decreased by increasing the wire width, the Q value of the antenna element 15 is improved.

By joining the first partial pattern 45b and the first partial pattern 45a which have relatively large width to the via conductor 17e which has an excellent heat radiation property, a temperature difference is unlikely to occur between the via conductor 17e and the first partial patterns 45b, 45a. As a result, the connection stability of these elements improves. This also applies to the via conductor 17c and the first partial patterns 45d, 45c.

During communication with the RWU 3, the IC chip 11 produces heat to reach a high temperature. However, the heat is radiated from the first partial patterns 45a to 45d that have relatively large widths. Thus, the IC chip 11 is protected from an excessive temperature increase.

If the RFID tag 1 is a passive tag, for example, the diameter of the outermost turn of the coil patterns 41a to 41d is increased by designing the first partial patterns 45a to 45d so as to have a larger width, efficient reception of the power from the RWU 3 is possible. As a result, a decrease of the communication distance is unlikely to occur.

Only the first partial patterns 45a to 45d that are provided in a specific direction when viewed from the winding centers Ca to Cd are made to have larger widths, and therefore, the directivity of the antenna element 15 and the directivity of heat radiation is controlled. This arrangement enables reducing the strength of a magnetic field radiated in unwanted directions and the heat radiation in unwanted directions, and the effects of the respective factors is significantly reduced.

In the present preferred embodiment, as for the coil pattern 41b, the inner end portion Sb and the outer end portion Eb are arranged in identical substantially identical directions when viewed from the winding center Cb. The same applies to the coil patterns 41c, 41d. More specifically, when viewed in plan from the z-axis direction, the positions where the inner end portions Sb to Sd are located are coincident or substantially coincident, and the positions where the outer end portions Eb to Ed are located are coincident or substantially coincident. As a result, in the coil patterns 41b to 41d provided on the bases 31b to 31d exclusive of the uppermost and lowermost layers, if an electric current is applied to opposite ends of the antenna element 15, the quantity of wire lines in which the direction of the electric current is identical preferably is equal. Due to this feature, strain occurring in the multilayer body 13 is significantly reduced or prevented, and the principal surface of the multilayer body 13 (i.e., the principal surface 33e) and a surface opposing that principal surface is made flatter. Further, heat is radiated in respective directions from the winding center axis in a well-balanced manner.

The positions where the via conductors 17c, 17e are located, the positions where the via conductors 17b, 17d are located, and the positions where the via conductors 17a and 17f to 17h are located are coincident or substantially coincident when viewed in plan from the z-axis direction, such that the quantity of vias is made small when viewed in plan from the z-axis direction. This arrangement enables preventing deterioration of the characteristics of the antenna element 15 which could be caused due to an electric current in the z-axis direction.

In the present preferred embodiment, the drawn-out conductor patterns 43a, 43c extend parallel or substantially parallel with the y-axis. The drawn-out conductor patterns 43b, 43d extend parallel or substantially parallel with the x-axis and overlap each other when viewed in plan from the z-axis direction. Thus, any two of the drawn-out conductor patterns 43a to 43d which are adjacent to each other in the z-axis direction are perpendicular or substantially perpendicular to each other. The drawn-out conductor patterns 43b, 43d overlap each other when viewed in plan from the z-axis direction. Thus, regularly arranging the drawn-out conductor patterns 43a to 43d enables preventing magnetic fields radiated from the main body portions of the coil patterns 41a to 41d from being disturbed by magnetic fields radiated from the drawn-out conductor patterns 43a to 43d.

In the present preferred embodiment, the first partial patterns 45a to 45d that have a relatively large width and the fourth partial patterns 411a to 411d that have a relatively large width extend toward the via conductors 17c, 17e. Further, the via conductors 17c, 17d are received at the vias by the first partial patterns 45a to 45d. As a result, the space between the first partial patterns 45 which are adjacent to each other in the z-axis direction and the space between the fourth partial patterns which are adjacent to each other in the z-axis direction increase. Thus, the effects of a variation in thickness of the respective partial patterns 45, 411 are reduced, and variations of the characteristics of the antenna element 15 are prevented.

All the drawn-out conductor patterns 43a to 43d do not extend in the same direction but in alternately different directions. Therefore, if the bases 31 are made of a ceramic material, deformation (strain) in the baking step is prevented.

The first partial patterns 45 extending from the outer end portions E and the drawn-out conductor patterns 43 extending from the inner end portions S are parallel or substantially parallel to each other. Thus, the tolerance for stacking errors which could occur in Step (4) is improved, and this feature enables stabilizing the characteristics of the antenna element 15.

In the above description of the present preferred embodiment, the first partial patterns 45a to 45d coupled to the outer end portions Ea to Ed have a larger width. However, the present invention is not limited to this example. The drawn-out conductor patterns 43a to 43d coupled to the inner end portions Sa to Sd may have a larger width.

Figure 7:
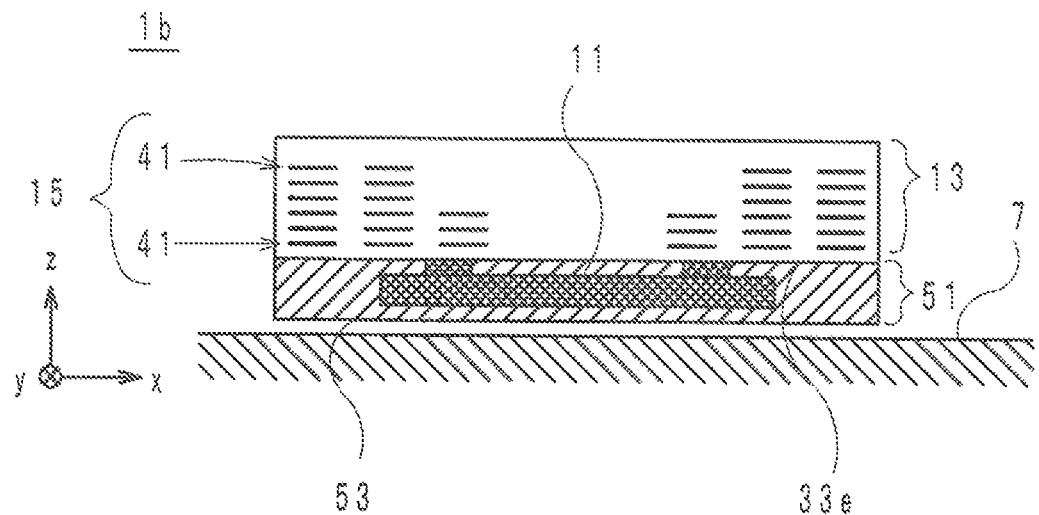
FIG. 7 is a vertical cross-sectional view of an antenna module according to a second preferred embodiment of the present invention.

FIG. 7 is a vertical cross-sectional view showing a configuration of a RFID tag 1b according to the second preferred embodiment of the present invention. The RFID tag 1b shown in FIG. 7 is different from the above-described RFID tag 1a in that, substantially, the multilayer body 13 is made of a ceramic material, the RFID tag 1b includes an overmold layer 51, and in the antenna element 15, the quantity of turns of the coil patterns 41 provided on the IC chip 11 side is relatively large. There is no other difference. Thus, in FIG. 7, elements corresponding to the elements of FIG. 1 to FIG. 6 are referred to using the same reference marks, and the description thereof is herein omitted.

The overmold layer 51 is made of a resin, for example, and overmolds the IC chip 11 mounted on the principal surface 33e of the multilayer body 13. The RFID tag 1b is attached to an object article 7 which is made of a metal or non-metal material, for example. In the present preferred embodiment, the RFID tag 1b is attached to the object article 7 at a surface 53 of the overmold layer 51 which is opposite to the principal surface 33e.

Among the plurality of coil patterns 41, a coil pattern 41 which is closer to the IC chip 11 has a larger quantity of turns as compared with more distant coil patterns 41.

Since the coil patterns 41 which are closer to the IC chip 11 have a larger quantity of turns, the center of mass of the RFID tag 1b is set on the opposite surface 53 side. Thus, the RFID tag 1b is stably attached to the object article 7.

By providing the coil patterns 41 which have a larger quantity of turns on a side which is close to the metal object article 7, the heat radiation effect improves.

Since a metal material which has a relatively high linear expansion coefficient is provided near the resin overmold layer 51 that has a relatively high linear expansion coefficient, the joint strength between the overmold layer 51 and the bases 31 is improved.

In the case where the RFID tag 1b is attached to a non-metal object article 7, even if a high frequency signal is applied to the antenna element 15 such that the RFID tag 1b produces a magnetic field, a diamagnetic field which is attributed to eddy currents would not occur because the object article 7 is made of a non-metal material. Therefore, the magnetic field of the RFID tag 1b penetrates through the non-metal material without decreasing the magnetic field strength. Thus, decrease of the communication distance is prevented from occurring.

Figure 8:
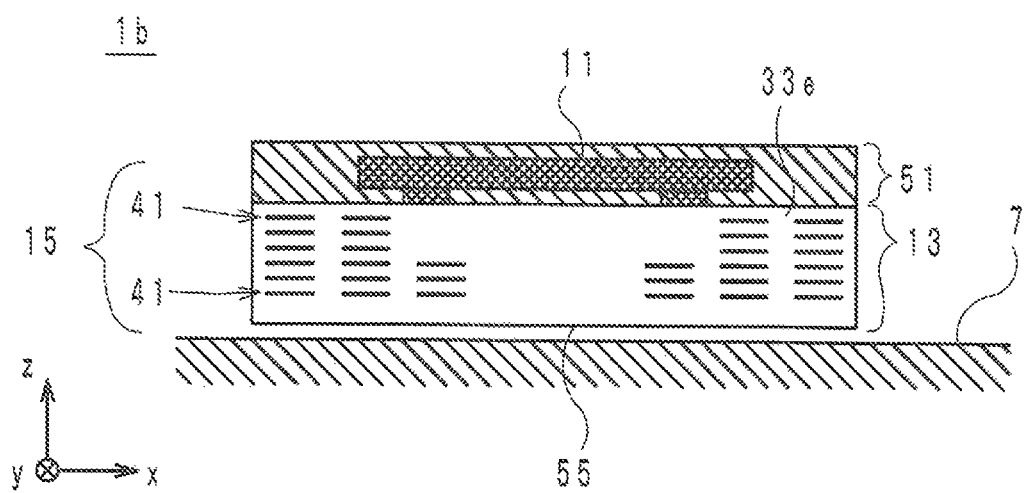
FIG. 8 is a vertical cross-sectional view of an antenna module according to a variation of the second preferred embodiment of the present invention.

In the above description of the second preferred embodiment, the coil patterns 41 provided on the IC chip 11 side have a relatively large quantity of turns, and the RFID tag 1b is attached to the object article 7 using the opposite surface 53 of the overmold layer 51. However, the present invention is not limited to this example. As shown in FIG. 8, the RFID tag 1b may be configured such that the coil patterns 41 which are relatively distant from the IC chip 11 have a relatively large quantity of turns, and that the RFID tag 1b is attached to the object article 7 at a surface 55 of the multilayer body 13 which is opposite to the principal surface 33e.

Figure 9:
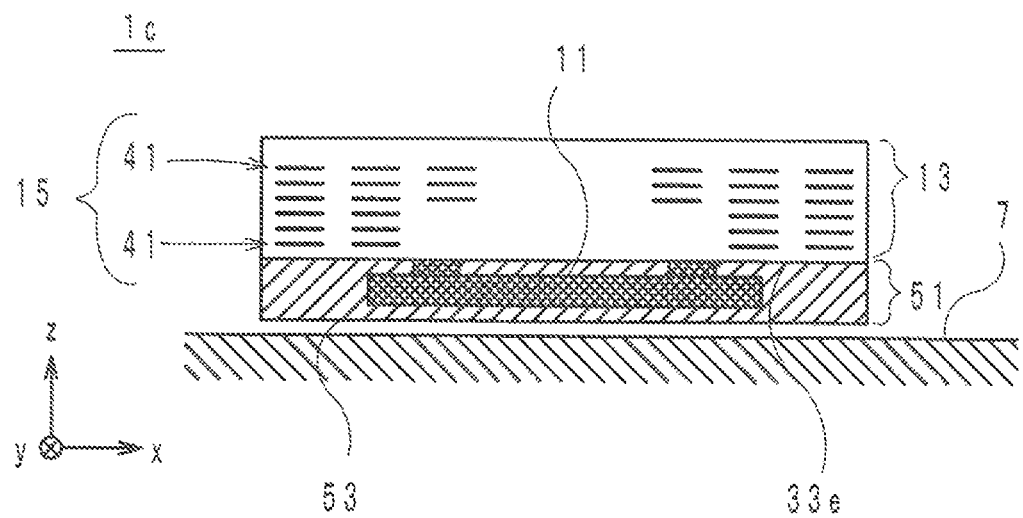
FIG. 9 is a vertical cross-sectional view of an antenna module according to a third preferred embodiment of the present invention.

FIG. 9 is a vertical cross-sectional view showing a configuration of a RFID tag 1c according to the third preferred embodiment of the present invention. The RFID tag 1c shown in FIG. 9 is different from the above-described RFID tag 1b of FIG. 7 in that, substantially, in the antenna element 15, the quantity of turns of the coil patterns 41 provided on the IC chip 11 side is relatively small. There is no other difference. Thus, in FIG. 9, elements corresponding to the elements of FIG. 7 are referred to using the same reference marks, and the description thereof is herein omitted.

Since the coil patterns 41 which are closer to the IC chip 11 have a smaller quantity of turns, even if the object article 7 is made of a metal material, the antenna element 15 is unlikely to be affected by a diamagnetic field which is attributed to the metal material at the time of radiation of a magnetic field.

Since the amount of the metal material that is the constituent of the coil patterns 41 is small on the IC chip 11 side that has a relatively small linear expansion coefficient, the joint strength between the IC chip 11 and the multilayer body 13 is improved.

Depending on the material of the object article 7, stray capacitance can occur between the object article 7 and the coil patterns 41. However, according to the present preferred embodiment, the amount of the metal material that is the constituent of the coil patterns 41 is small on the side which is closer to the object article 7. Therefore, if the RFID tag 1c is attached to the object article 7, a variation of the stray capacitance which is attributed to the material of the object article 7 is small.

Figure 10:
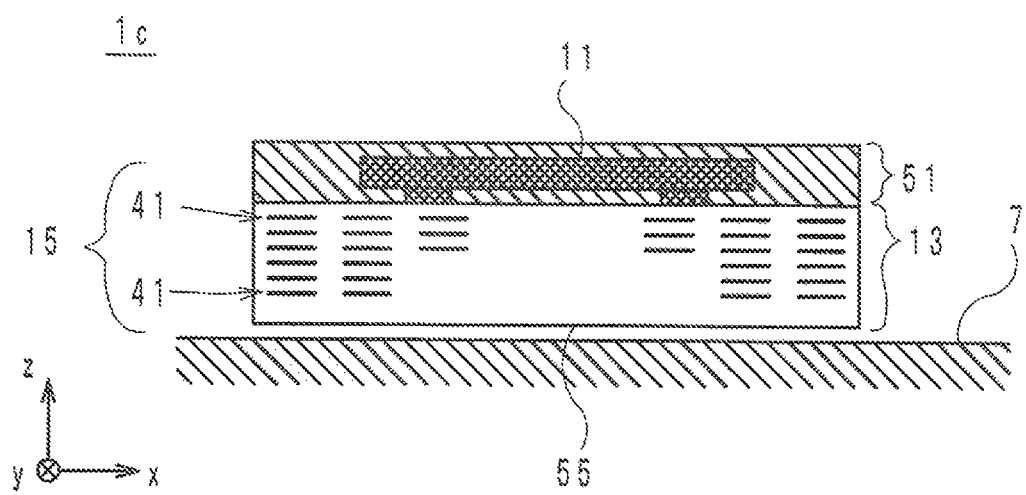
FIG. 10 is a vertical cross-sectional view of an antenna module according to a variation of the third preferred embodiment of the present invention.

In the above description of the third preferred embodiment, the RFID tag 1c is configured such that the coil patterns 41 which have a smaller quantity of turns are provided closer to the IC chip 11, and the RFID tag 1c is attached to the object article 7 using the opposite surface 53 of the overmold layer 51. However, the present invention is not limited to this example. As shown in FIG. 10, the RFID tag 1c may be configured such that the coil patterns 41 which have a relatively small quantity of turns are provided on a side which is distant from the IC chip 11, and that the RFID tag 1c is attached to the object article 7 at a surface 55 of the multilayer body 13 which is opposite to the principal surface 33e.

Figure 11:
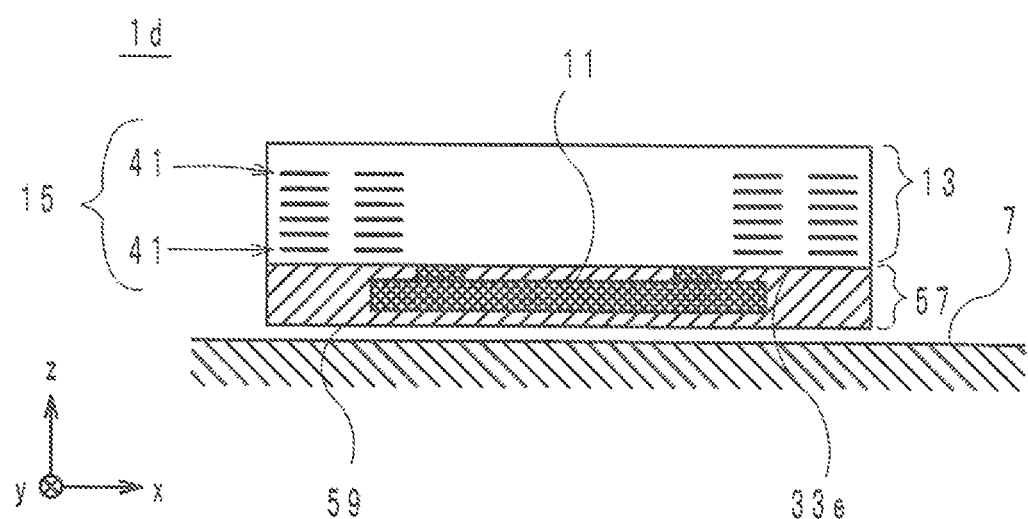
FIG. 11 is a vertical cross-sectional view of an antenna module according to a fourth preferred embodiment of the present invention.

FIG. 11 is a vertical cross-sectional view showing a configuration of a RFID tag 1d according to the fourth preferred embodiment of the present invention. The RFID tag 1d shown in FIG. 11 is different from the above-described RFID tag 1a in that, substantially, each of the bases 31 is made of a dielectric material of a relatively high dielectric constant, and that the RFID tag 1d further includes an overmold layer 57 which is made of a dielectric material of a relatively low dielectric constant. There is no other difference. Thus, in FIG. 11, elements corresponding to the elements of FIG. 1 to FIG. 6 are referred to using the same reference marks, and the description thereof is herein omitted.

The overmold layer 57 overmolds the IC chip 11 mounted on the principal surface 33e of the multilayer body 13. The RFID tag 1d is attachable to the object article 7 which is made of a metal material, for example. According to the present preferred embodiment, the RFID tag 1d is attached to the object article 7 at a surface 59 of the overmold layer 57 which is opposite to the principal surface 33e.

In the present preferred embodiment, the RFID tag 1d may be attached to the object article 7 using the opposite surface 59. In this case, the overmold layer 57 that has a relatively low dielectric constant is present between the antenna element 15 and the object article 7. Here, the magnetic permeability of the overmold layer 57 is proportional to the dielectric constant of the overmold layer 57 (the proportionality constant is the square of the characteristic impedance). Therefore, a magnetic field radiated from the antenna element 15 is unlikely to pass through the overmold layer 57 that has a relatively low dielectric constant in the z-axis direction, and hence is unlikely to reach the metal object article 7. Due to this feature, a magnetic field radiated from the antenna element 15 is unlikely to be affected by a diamagnetic field which is attributed to eddy currents.

Since the bases 31 are made of a material which has a relatively high dielectric constant, the inductance value of the antenna element 15 is increased. As a result, the quantity of the coil patterns 41 that are constituents of the antenna element (in other words, the quantity of layers of the bases 31) is reduced, and the distance between the outermost coil patterns 41 along the z-axis direction in the antenna element 15 is smaller than the thickness in the z-axis direction of the overmold layer 57.

Even if the object article 7 is made of a metal material, occurrence of stray capacitance between the antenna element 15 and the object article 7 is prevented because the material of the overmold layer 57 has a low dielectric constant. As a result, the variation (particularly, decrease) of the self-resonant frequency of the antenna element 15 is prevented. Further, the bases 31 have a high dielectric constant, and accordingly, in the self-resonant frequency of the antenna element 15, the line capacitance between the plurality of coil patterns 41 is dominant. Therefore, irrespective of the material of the object article 7, the self-resonant frequency of the antenna element 15 is unlikely to deviate from a desired value.

Figure 12:
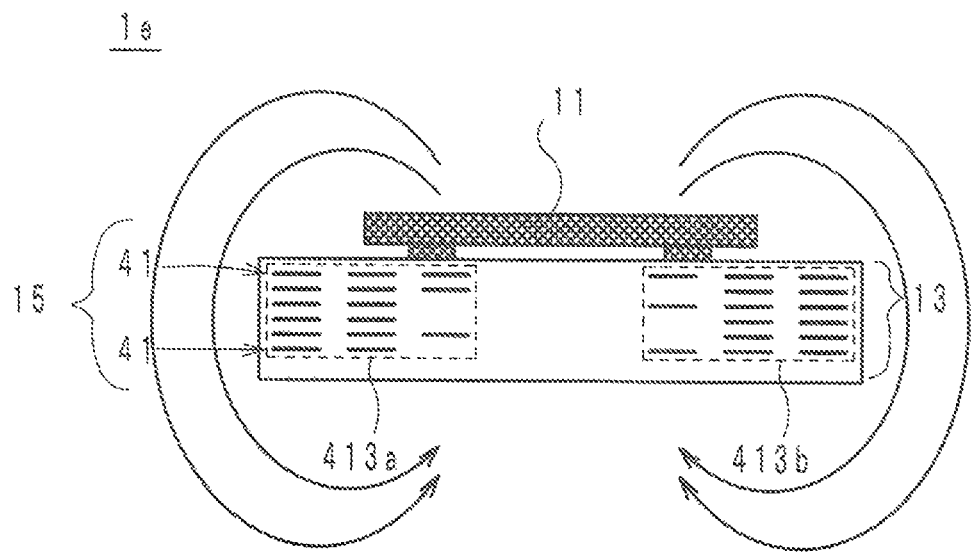
FIG. 12 is a vertical cross-sectional view of an antenna module according to a fifth preferred embodiment of the present invention.

FIG. 12 is a vertical cross-sectional view showing a configuration of a RFID tag 1e according to the fifth preferred embodiment of the present invention. The RFID tag 1e shown in FIG. 12 is different from the above-described RFID tag 1a in that, substantially, the antenna element 15 is different in the points which will be described below. There is no other difference. Thus, in FIG. 12, elements corresponding to the elements of FIG. 1 to FIG. 6 are referred to using the same reference marks, and the description thereof is herein omitted.

In FIG. 12, the coil patterns 41 can be grouped into four types of partial patterns 413a to 413d according to the direction of flow of an electric current if the electric current is applied at opposite ends of the antenna element 15. Here, in FIG. 12, two types of partial patterns in which the directions of flow of electric currents are opposite to each other, the first partial patterns 413a and the second partial patterns 413b, are only shown. For the convenience of illustration, the third partial patterns 413c and the fourth partial patterns 413d are not shown. In the present preferred embodiment, if the entire antenna element 15 is considered, the total quantity TNa, which means the total quantity of the first partial patterns 413a, and the total quantity TNb, which means the total quantity of the second partial patterns 413b, are equal to each other. However, if a single coil pattern 41 is considered, the quantity Na, which means the total quantity of the first partial patterns 413a and the quantity Nb, which means the total quantity of the second partial patterns 413b are different from each other. It is noted that, as used herein, "total quantity" refers to an amount or a number of the partial pattern, such as an amount or number of pieces or other physical objects or characteristics of the partial pattern, for example.

As described above, if the total quantities TNa, TNb are equal to each other, magnetic force lines radiated from the RFID tag 1e extend in the z-direction. Therefore, the RFID tag 1e is capable of having a communication with the RWU 3 that is present in the z-axis direction of the RFID tag 1e.

If the total quantities TNa, TNb are equal to each other, heat produced inside the RFID tag 1e is radiated generally uniformly around the RFID tag 1e. Further, if the total quantities TNa, TNb are equal to each other, strain produced by stacking the plurality of bases 31 significantly reduced or prevented, and the RFID tag 1e can be manufactured so as to have a more precise rectangular parallelpiped shape.

Figure 13:
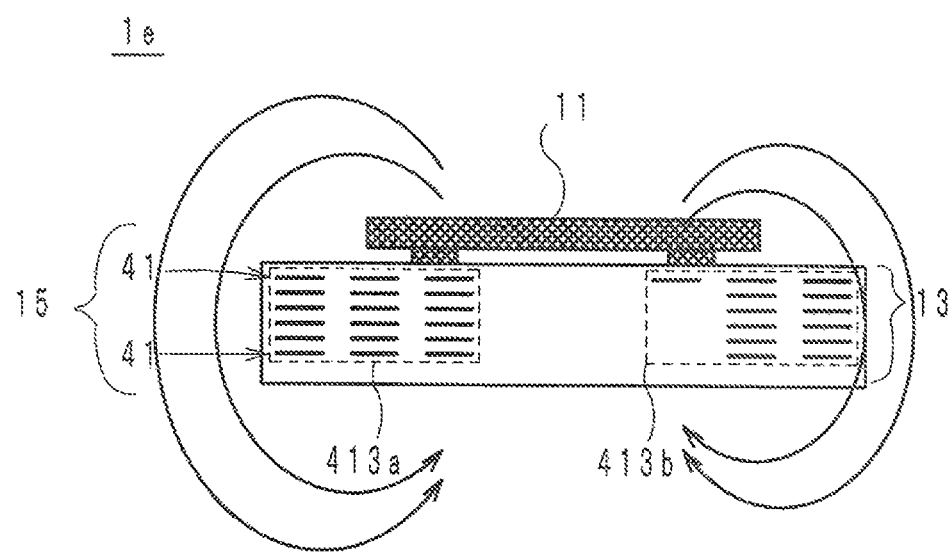
FIG. 13 is a vertical cross-sectional view of an antenna module according to a variation of the fifth preferred embodiment of the present invention.

In the above description of the fifth preferred embodiment, the RFID tag 1e is configured such that, if the entire antenna element 15 is considered, the total quantities TNa, TNb are equal to each other, but if a single coil pattern 41 is considered, the numbers Na, Nb are different from each other. However, the present invention is not limited to this example. In the RFID tag 1e, as shown in FIG. 13, if the entire antenna element 15 is considered, the total quantities TNa, TNb may be different from each other.

As previously described, if the total quantities TNa, TNb are different from each other, the strength of a magnetic field radiated from the RFID tag 1e is biased to the side of the larger total quantity (in the example shown in the drawing, it is biased to the total quantity TNa side). Thus, the RFID tag 1e is capable of having a communication with the RWU 3 which is present at a more distant place so long as the RWU 3 is present in a direction of a large magnetic field strength. As described herein, according to the present preferred embodiment, by adjusting the total quantity of partial patterns that are constituents of the coil pattern 41, the directivity of the antenna element 15 is capable of being controlled.

The radiating direction of the heat produced inside the RFID tag 1e is adjusted according to the total quantities TNa, TNb. Thus, the design flexibility of an electronic device in which the RFID tag 1e is to be incorporated is improved. For example, electronic components which are vulnerable to heat may be arranged in a direction to which radiation of the heat is small relative to the RFID 5.

In the foregoing, each of the RFID tags 1a to 1e has been described. However, the present invention is not limited to the examples illustrated above. At least two or more of the RFID tags 1a to 1e, and/or features thereof, may be combined.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A structure for attachment of an antenna module to an object article, wherein:
   the antenna module includes a multilayer body including a plurality of insulative layers, a first principal surface, a second principal surface, an IC chip provided on or in the multilayer body, and an antenna element coupled to the IC chip;
   the antenna element includes a plurality of coil patterns arranged in a stacking direction of the insulative material of the multilayer body;
   the antenna module is attached to the object article with the first principal surface of the multilayer body defining an attachment surface of the multilayer body to the object article;
   one of the plurality of coil patterns arranged nearer to the first principal surface includes a larger number of turns than another one of the plurality of coil patterns arranged farther from the first principal surface than the one of the plurality of coil patterns; and the IC chip is provided on one of the first principal surface and the second principal surface of the multilayer body.

2. The structure for attachment according to claim 1, wherein the IC chip is sealed by an overmold layer, and the antenna module is attached to the object article via an outer surface of the overmold layer.

3. The structure for attachment according to claim 1, wherein the object article is a metal article.

4. The structure for attachment according to claim 1, wherein each of the plurality of coil patterns has the same or substantially the same outer diameter as one another.

* * * * *